United States Patent
Chen et al.

(10) Patent No.: US 9,601,360 B2
(45) Date of Patent: Mar. 21, 2017

(54) WAFER TRANSPORT METHOD

(71) Applicant: Taiwan Semiconductor Manufacturing Co., Ltd., Hsin-Chu (TW)

(72) Inventors: Jyun-Chao Chen, Hsinchu (TW); Ming-Jung Chen, Hsinchu (TW); Shao-Yen Ku, Jhubei (TW); Tsai-Pao Su, Donggang Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/658,867

(22) Filed: Mar. 16, 2015

(65) Prior Publication Data
US 2016/0276186 A1 Sep. 22, 2016

(51) Int. Cl.
*H01L 21/67* (2006.01)
*H01L 21/677* (2006.01)
*H01L 21/673* (2006.01)

(52) U.S. Cl.
CPC .. *H01L 21/67294* (2013.01); *H01L 21/67276* (2013.01); *H01L 21/67745* (2013.01); *H01L 21/673* (2013.01)

(58) Field of Classification Search
None
See application file for complete search history.

(56) References Cited

U.S. PATENT DOCUMENTS

| | | | | |
|---|---|---|---|---|
| 6,519,498 B1* | 2/2003 | Jevtic | ............... | G05B 19/41865 700/100 |
| 6,817,823 B2* | 11/2004 | Fix | ............... | H01L 21/67778 414/217 |
| 7,505,828 B2 | 3/2009 | Chen et al. | | |
| 7,648,848 B2* | 1/2010 | Ebe | ............... | H01L 21/2007 438/14 |
| 7,925,380 B2 | 4/2011 | Yu et al. | | |
| 8,798,778 B2* | 8/2014 | Schmidt | ............... | G05B 19/41835 438/905 |
| 2008/0051930 A1* | 2/2008 | Oh | ............... | H01L 21/67276 700/214 |
| 2008/0310939 A1 | 12/2008 | Ku et al. | | |
| 2014/0141541 A1 | 5/2014 | Tsai et al. | | |

* cited by examiner

*Primary Examiner* — John C Ingham
(74) *Attorney, Agent, or Firm* — McClure, Qualey & Rodack, LLP

(57) ABSTRACT

A wafer transport method is provided. The wafer transport method includes loading an initial carrier containing a first wafer and a second wafer on a first semiconductor apparatus, and processing the first wafer by the first semiconductor apparatus, and loading the first wafer into a first carrier disposed on the first semiconductor apparatus. The wafer transport method also includes processing the second wafer by the first semiconductor apparatus, and loading the second wafer into a second carrier disposed on the first semiconductor apparatus. The wafer transport method further includes processing the first wafer by a second semiconductor apparatus, and loading the first wafer into an integration carrier disposed on the second semiconductor apparatus. The wafer transport method further includes processing the second wafer by the second semiconductor apparatus, and loading the second wafer into the integration carrier disposed on the second semiconductor apparatus.

20 Claims, 15 Drawing Sheets

WAFER TRANSPORT METHOD

BACKGROUND

The manufacture of semiconductor devices involves the performance of a series of processing steps using a variety of high-tech production and metrology tools in a certain order and often within a certain period of time (such as quality-control time).

The primary function of a wafer logistics system in a wafer fabrication facility, or "fab," is to deliver wafers to each of the tools at the right time, as well as to track the location and status of the wafers throughout the process. In addition, automated material handling systems, AMHS, are applied to wafer fabs to carry out automated functions more efficiently, consistently, and safely than can be done via manual means.

However, with the development of semiconductor processes, the quality-control time has become shorter and shorter. Although existing wafer transport methods have been generally adequate for their intended purposes, they have not been entirely satisfactory in all respects. Consequently, it would be desirable to provide a solution for improving the transportation of wafers.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
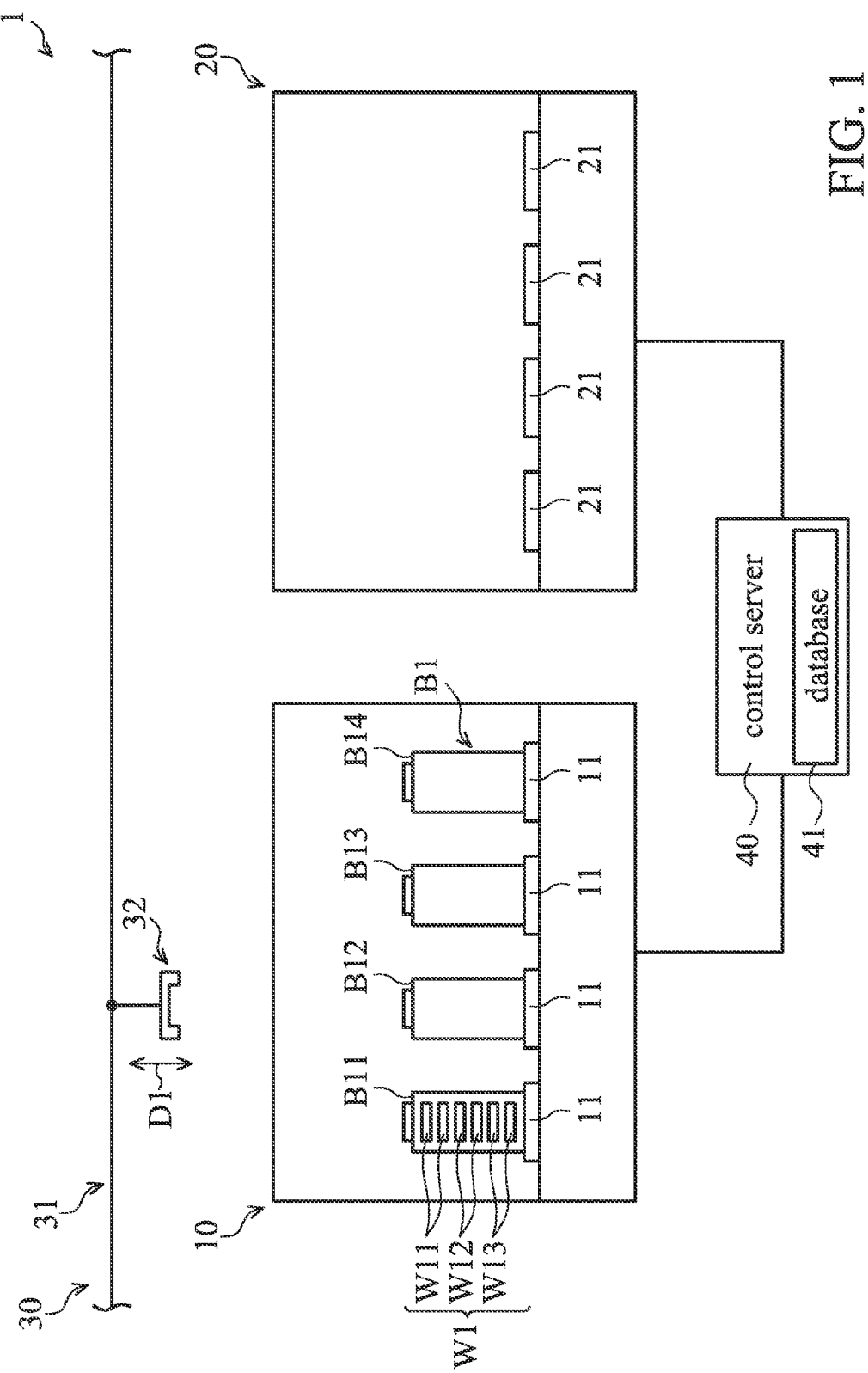
FIG. 1 is a schematic view of a wafer transport system in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A wafer transport system and method for a wafer fabrication facility are provided. The processing period of the wafers in a carrier processed by at least two semiconductor apparatuses is decreased, and the wafers are easily processed by a subsequent semiconductor apparatus within a quality-control time (Q-time).

FIG. 1 is a schematic view of a wafer transport system 1 in accordance with some embodiments of the disclosure. The wafer transport system 1 includes a number of semiconductor apparatuses 10 and 20, an OHT (Over Hoist Transport) system 30, and a control server 40. The semiconductor apparatuses 10 and 20 are configured to perform semiconductor manufacturing processes on wafers W1.

In some embodiments, the semiconductor apparatus 10 or 20 is a chemical mechanical polishing (CMP) apparatus, a physical vapor deposition (PVD) apparatus, a chemical vapor deposition (CVD) apparatus, an ion implant apparatus, an epitaxy apparatus, a sputter apparatus, a thermal processing apparatus, an etching apparatus, a photolithography apparatus, a wet cleaning apparatus, a dry cleaning apparatus, or another suitable apparatus.

In some embodiments, the semiconductor manufacturing process is a CMP process, a PVD process, a CVD process, an ALD process, a doping process, a screen printing process, a dry etching process, a wet etching process, a photolithography process, a baking process, a wet cleaning process, a dry cleaning process, or another suitable processes.

The semiconductor apparatuses 10 and 20 include load ports 11 and 21. The load ports 11 and 21 are configured to load carriers B1. In general, the semiconductor apparatus 10 (or 20) includes, but is not limited to, one to four load ports 11 (or 21). The carriers B1 are configured to contain wafers W1. In some embodiments, some of the carriers B1 are empty carriers not containing any wafers W1. In some embodiments, the carrier B1 is a wafer pod, a front opening unified pod (FOUP), a wafer lot, a wafer cassette, or a wafer boat.

When the carrier B1 is loaded at one of the load ports 11 or 21, the semiconductor apparatus 10 or 20 takes one or more wafers W1 at the same time from the carrier B1. After the wafer W1 is processed by the semiconductor apparatus, the wafer W1 is put back into the carrier B1 or put into another carrier B1.

The OHT system 30 includes a number of tracks 31 and a number of vehicles 32. In FIG. 1, only one track 31 and one vehicle 32 are illustrated for clarity. The vehicle 32 is moveable along the track 31. The vehicle 32 is configured to transport one of the carriers B1. In some embodiments, the vehicle 32 transports the carrier B1 from the semiconductor apparatus 10 to the semiconductor apparatus 20.

Furthermore, the vehicle 32 is able to move along a vertical direction D1. In some embodiments, the vehicle 32 moves downwardly to attach the carrier B1 loaded at the load port 11 or 21, and then the vehicle 32 hoists the carrier B1 to a position close to the track 31, and then the vehicle 32 with the carrier B1 moves along the track 31. In some embodiments, the vehicle 32 moves downwardly to put the carrier B1 at the load port 11 or 21, and then the vehicle 32 detaches the carrier B1. Afterward, the vehicle 32 leaves from the carrier B1 and rises up to back to a position close to the track 31.

The control server 40 is coupled with the semiconductor apparatuses 10 and 20, and the OHT system 30. The control server 40 is configured to control the vehicle 32 and communicate with the semiconductor apparatuses 10 and 20. In some embodiments, the control server 40 includes a wafer logistics module. The control server 40 includes a database 41 storing units of wafer-carrier information. Each unit of the wafer-carrier information corresponds to one of the carriers B1.

Figure 2:
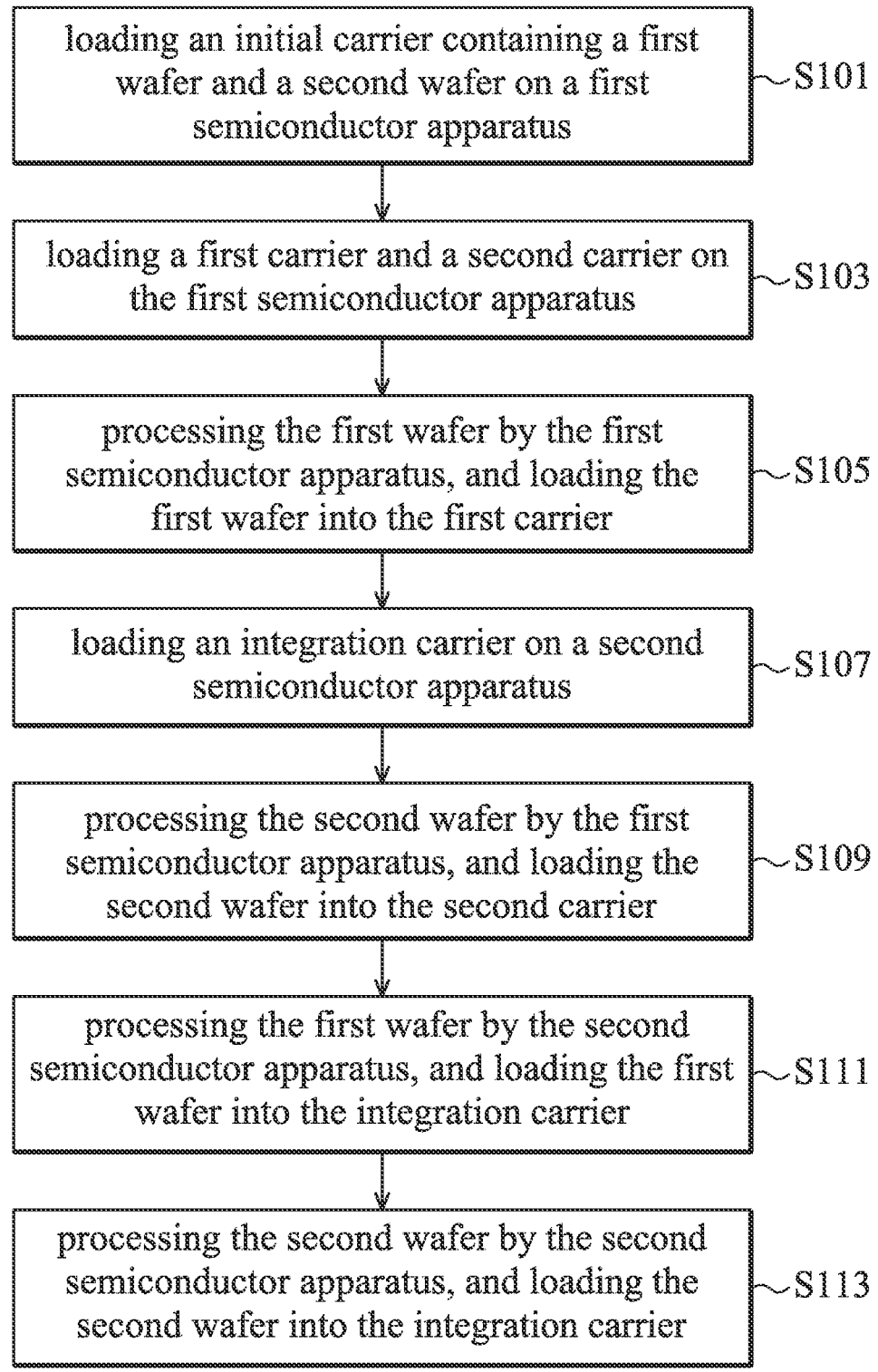
FIG. 2 is a flow chart of a wafer transport method in accordance with some embodiments of the disclosure.

FIG. 2 is a flow chart of a wafer transport method in accordance with some embodiments of the disclosure. FIGS. 3A to 3E are schematic views of the wafer transport system during intermediate stages of the transport method. In step S101, one of the carriers B1, assigned as an initial carrier B11, is loaded onto one of the load ports 11 of the semiconductor apparatus 10 by vehicle 32, as shown in FIG. 1, and the initial carrier B11 contains a number of wafers W1. In some embodiments, the initial carrier B11 is loaded onto the load port 11 manually.

In some embodiments, when the initial carrier B11 is loaded at the load port 11, the semiconductor apparatus 10 obtains the wafer-carrier information corresponding to the initial carrier B11 from the database 41 of the control server 40. In some embodiments, each unit of the wafer-carrier information includes carrier ID (identification code) and units of wafer data. The carrier ID corresponds to one of the carriers B1, and each unit of the wafer data corresponds to one of the wafers W1 contained in the initial carrier B11.

In some embodiments, the semiconductor apparatus 10 obtains the carrier ID of the initial carrier B11 via the load port 11. The semiconductor apparatus 10 transmits a carrier-information request signal to the control server 40. The control server 40 searches and selects one unit of the wafer-carrier information having the carrier ID from the database 41.

In some embodiments, the control server 40 determines whether the wafers W1 in the initial carrier B11 need to be processed in a diving process according to the number of wafers W1 in the initial carrier B11 and the quality-control time (Q-time) of the wafers W1 processed by the semiconductor apparatus 10. The quality-control time is defined as the time period for the wafers W1 in the carrier B1 to be processed by a subsequent semiconductor apparatus 20.

For example, if the wafer W1 processed by the semiconductor apparatus 10 have a quality-control time in a range from about 30 minutes to about 120 minutes, and the number of wafers W1 in the initial carrier B11 is greater than 4, or in a range from 4 to 30, the control server 40 determines processing a diving process to the wafers W1 in the initial carrier B11.

In some embodiments, when the control server 40 processes a diving process, the control server 40 divides the wafers W1 into several groups for decreasing the processing period of the wafers W1 in the initial carrier B11 processed by the semiconductor apparatuses 10 and 20, and for the wafers W1 in the initial carrier B11 processed by the semiconductor apparatus 20 in the quality-control time. In some embodiments, the number of groups of wafers W1 is in a range from about 2 to about 15. In some embodiments, the number of wafers W1 in one group is in a range from about 1 to about 20. The numbers of wafers W1 in different groups are not necessarily the same.

In some embodiments, the number of groups varies according to the number of wafers W1 in the initial carrier B11 and the quality-control time of the wafers W1. The number of groups is high when there are many wafers W1 in the initial carrier B11 and the quality-control time is short. The number of groups is low when there are fewer wafers W1 in the initial carrier B11 and the quality-control time is long.

For example, when the number of wafers W1 is 25, and the quality-control time is 60 minutes, the wafers W1 may be divided into five groups. In some embodiments, the number of wafers W1 is 18, and the quality-control time is 90 minutes, the wafers W1 may be divided into three groups.

When the number of groups is determined, the control server 40 adds group codes into the wafer-carrier information, and relative to the wafer data. For example, when the wafers W1 are divided into three groups, the control server 40 assigns a first group code to some of the wafers W1, a second group code to other wafers W1, and a third group code to the remaining wafers W1. The first, second, and third group codes are added to the wafer-carrier information, and each of the first, second, and third group codes are relative to one of the wafer data.

Afterward, the control server 40 transmits the wafer-carrier information having the group codes to the semiconductor apparatus 10. Accordingly, the wafers W1 relative to the first group code are assigned as first wafers W11, the wafers W1 relative to the second group codes are assigned as second wafers W12, and the wafers W1 relative to the third group codes are assigned as third wafers W13.

In some embodiments, the semiconductor apparatus 10 determines whether the wafers W1 in the initial carrier B11 need to be processed in a diving process, and it processes the diving process. The semiconductor apparatus 10 receives the wafer-carrier information from the control server 40, and adds the group codes to the wafer-carrier information. Moreover, the semiconductor apparatus 10 transmits the wafer-carrier information having group codes to the control server 40.

In step S103, a number of empty carriers B1 are loaded onto the load ports 11 of the semiconductor apparatus 10 by vehicle 32 as shown in FIG. 1. In some embodiments, the empty carriers B1 are manually loaded onto the load ports 11.

The empty carriers B1 do not need to be loaded onto the load ports 11 at the same time, especially when some of the load ports 11 are unavailable, or the number of empty carriers B1 is greater than the number of available load ports 11.

The number of empty carriers B1 loaded onto the load ports 11 varies according to the number of groups of the wafer W1 in the initial carrier B11. For example, when the number of groups is three, there are three empty carriers B1 loaded onto the load ports 11. Accordingly, one of the empty carriers B1 is assigned as a first carrier B12, one of the empty carriers B1 is assigned as a second carrier B13, and one of the empty carriers B1 is assigned as a third carrier B14.

In some embodiments, the first carrier B12, the second carrier B13, and the third carrier B14 are loaded onto the load ports 11 in sequence to increase the utilization rate of the load ports 11. The arrangement of the first carrier B12, the second carrier B13, and the third carrier B14 on the load ports 11 is not limited by FIG. 1.

In some embodiments, the first carrier B12 is loaded onto the load port 11 before the first wafers W11 are processed by the semiconductor apparatus 10. The first carrier B12 is loaded onto the load port 11 after the wafers W1 are assigned the group codes.

In some embodiments, the second carrier B13 is loaded onto the load port 11 before the second wafers W12 are processed by the semiconductor apparatus 10. In some embodiments, the second carrier B13 is loaded onto the load port 11 before the first carrier B12 is detached from the load port 11. In some embodiments, the second carrier B13 is loaded onto the load port 11 after the wafers W1 are assigned group codes. In some embodiments, the second carrier B13 is loaded onto the load port 11 after the first wafers W11 are processed by the semiconductor apparatus 10.

The third carrier B14 is loaded onto the load port 11 before the third wafers W13 are processed by the semiconductor apparatus 10. In some embodiments, the third carrier B14 is loaded onto the load port 11 before the second carrier B13 is detached from the load port 11. In some embodiments, the third carrier B14 is loaded onto the load port 11 after the wafers W1 are processed by the semiconductor apparatus 10. In some embodiments, the third carrier B14 is loaded onto the load port 11 after the second wafers W12 are processed by the semiconductor apparatus 10.

In step S105, the semiconductor apparatus 10 processes the wafers W1 in sequence by a semiconductor manufacturing process. In some embodiments, the semiconductor apparatus 10 is an etching apparatus, and the semiconductor manufacturing process is a dry etching process.

Figure 3A:
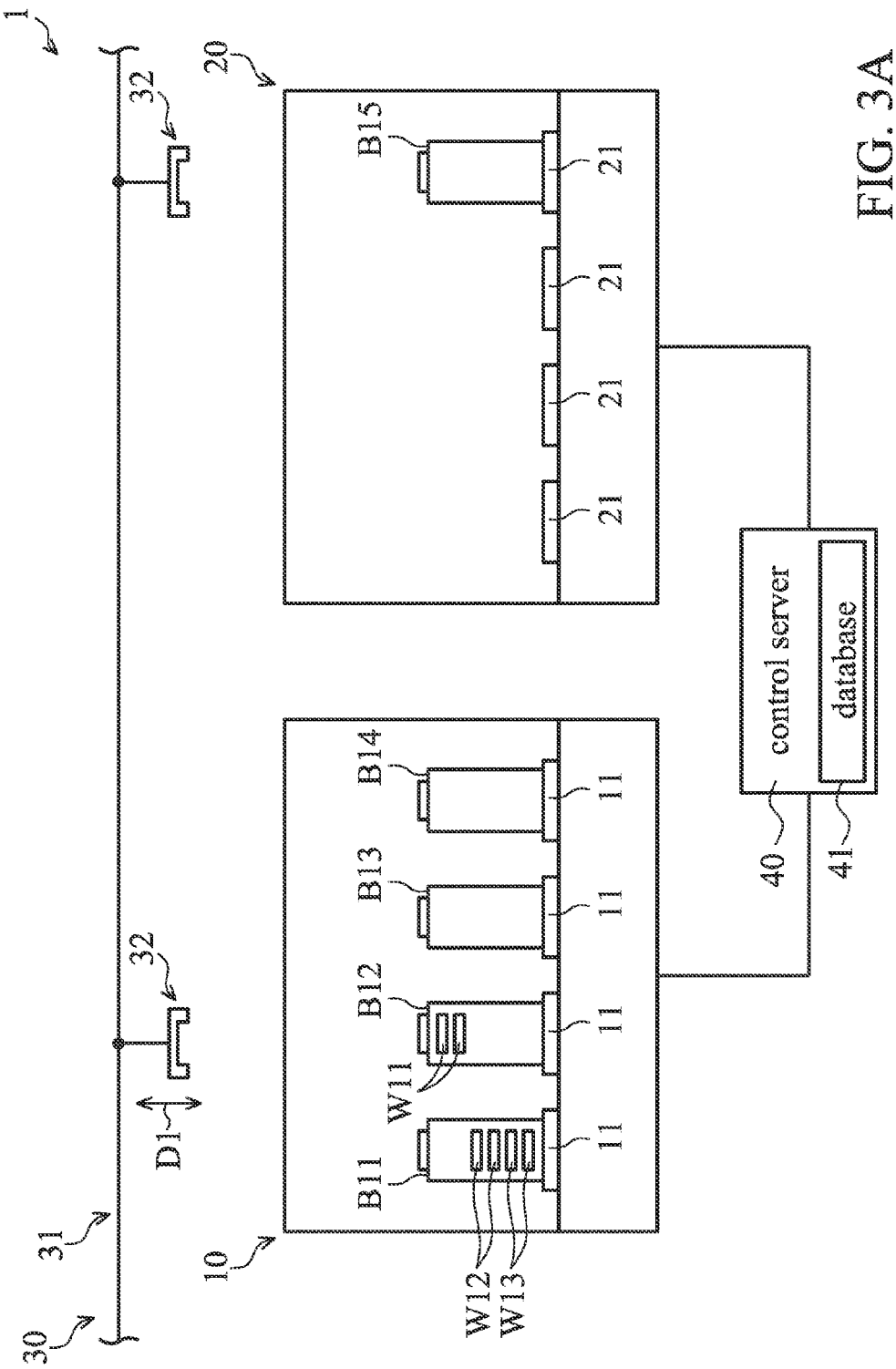
FIGS. 3A to 3E are schematic views of the wafer transport system during intermediate stages of the transport method.

After the first wafers W11 are processed by the semiconductor apparatus 10, the first wafers W11 relative to the first group code are loaded into the first carrier B12 disposed on the load port 11 of the semiconductor apparatus 10, as shown in FIG. 3A.

Figure 3B:
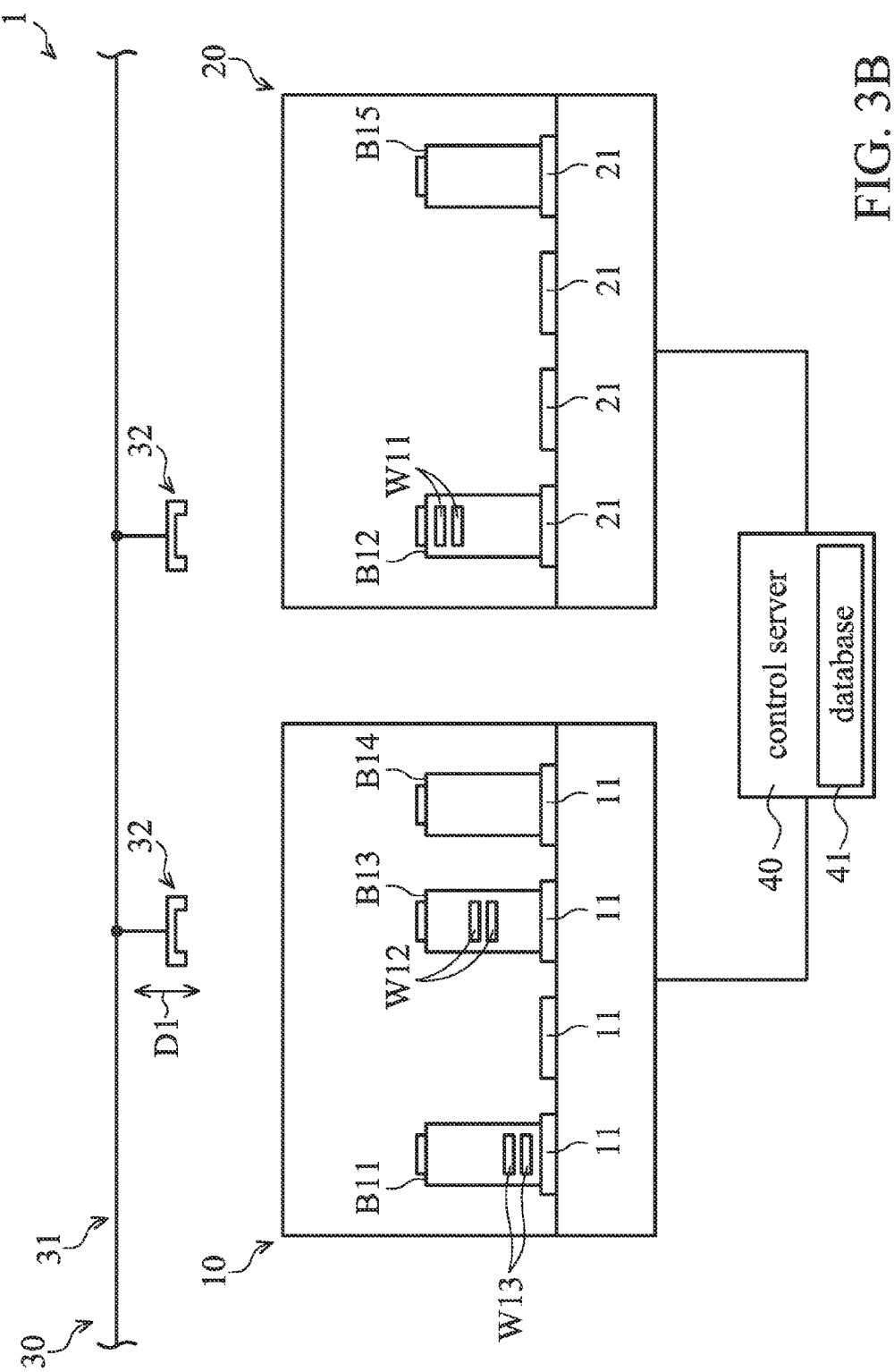

After the first wafers W11 are loaded into the first carrier B12, the first carrier B12 with the first wafers W11 is transported to the semiconductor apparatus 20 by the vehicle 32, as shown in FIG. 3B. Since it is not necessary to wait for the second wafers W12 and the third wafers W13 to be processed by the semiconductor apparatus 10, the first wafers W11 can be processed by the semiconductor apparatus 20 early. Therefore, the processing period of the first wafers W11 processed by the semiconductor apparatuses 10 and 20 is decreased, and the first wafers W11 are easily processed by the semiconductor apparatus 20 within the quality-control time.

In step S107, an integration carrier B15 is loaded onto the second load port 21 of the semiconductor apparatus 20 before the first wafer W11 is processed by the semiconductor apparatus 20 as shown FIGS. 1, 3A and 3B. In some embodiments, the integration carrier B15 is loaded onto the second load port 21 before the first carrier B12 is loaded onto the second load port 21. In some embodiments, the integration carrier B15 is an empty carrier B1.

In some embodiments, the integration carrier B15 is loaded onto the second load port 21 after the wafers W1 are assigned group codes. In some embodiments, the integration carrier B15 is loaded onto the second load port 21 after the first wafers W11 are processed by the semiconductor apparatus 10. In some embodiments, the integration carrier B15 is loaded onto the second load port 21 after the first carrier B12 is detached from the load port 11.

In step S109, after the second wafers W12 are processed by the semiconductor apparatus 10, the second wafers W12 relative to the second group code are loaded into the second carrier B13 disposed on the load port 11 of the semiconductor apparatus 10, as shown in FIG. 3B.

Therefore, the wafers W1 do not need to be loaded into different carriers B1 by a sorter apparatus before the initial carrier B11 containing the wafers W1 is loaded onto the first port 11. The operation time of the wafers W1 loaded into different carriers B1 by sorter apparatus is reduced.

Figure 3C:
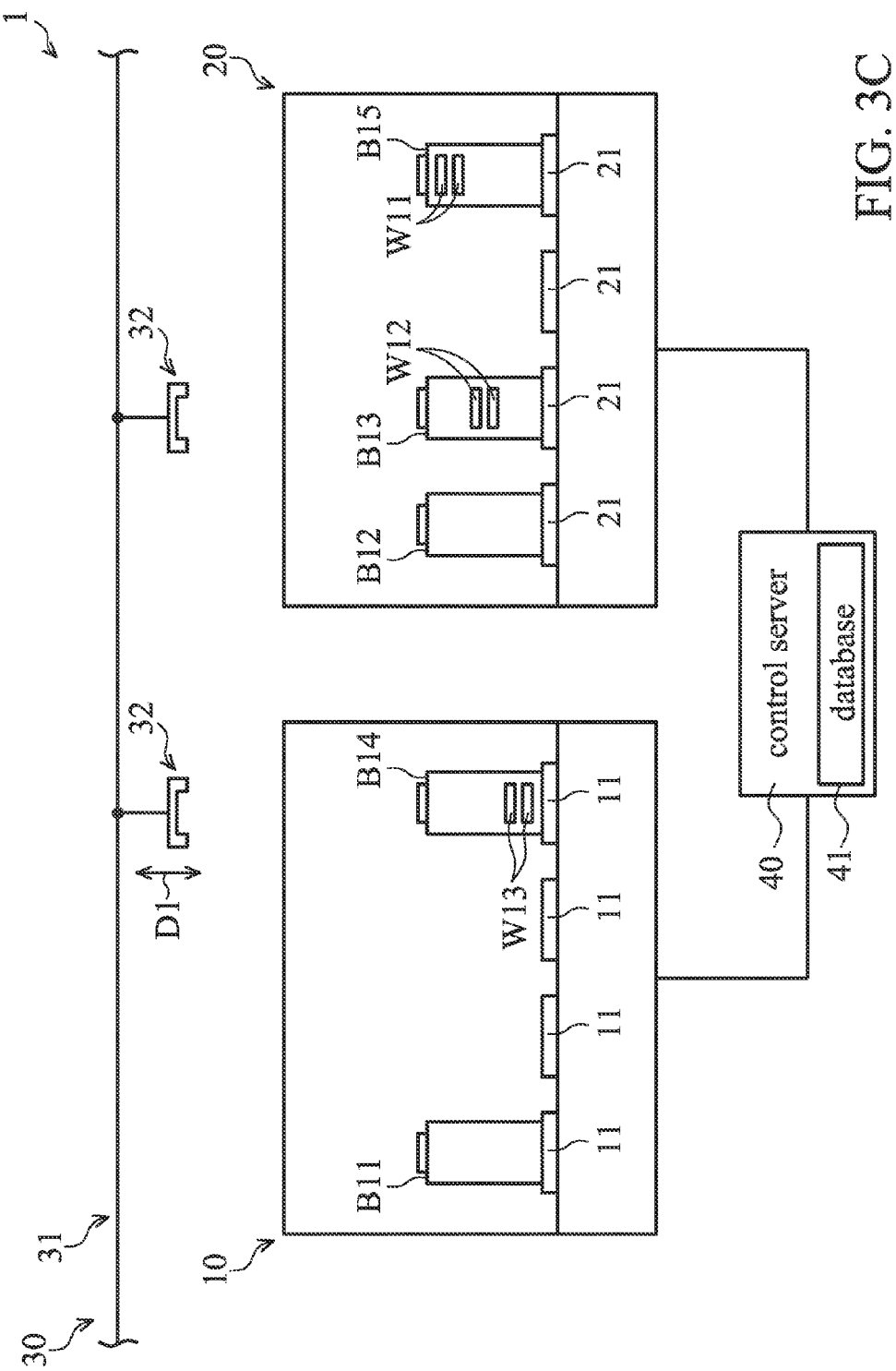

After the second wafers W12 are loaded into the second carrier B13, the second carrier B13 with the second wafers W12 are transported to the semiconductor apparatus 20 by the vehicle 32, as shown in FIG. 3C. Since it is not necessary to wait for the third wafers W13 to be processed by the semiconductor apparatus 10, the second wafers W12 can be processed by the semiconductor apparatus 20 early. Therefore, the processing period of the second wafers W12 processed by the semiconductor apparatuses 10 and 20 is decreased, and the second wafers W12 are easy processed by the semiconductor apparatus 20 within the quality-control time.

In addition, as shown in FIG. 3B, when the second wafers W12 are processed by the semiconductor apparatus 10, the first carrier B12 is detached from the load port 11 or loaded onto the second load port 21. Therefore, the processing period of the first wafers W11 processed by the semiconductor apparatuses 10 and 20 is decreased.

In step S111, the semiconductor apparatus 20 processes the wafers W1 by a semiconductor manufacturing process. In some embodiments, the semiconductor apparatus 20 is a wet cleaning apparatus, and the semiconductor manufacturing process is a wet cleaning process.

As shown in FIG. 3C, the first carrier B12 is loaded onto the second load port 210. When the semiconductor apparatus 20 is ready to perform semiconductor manufacturing processes on the first wafers W11, the semiconductor apparatus 20 opens a door (not shown in figures) of the first carrier B12, and takes the first wafers W11 from the first carrier B12 by a wafer arm (not shown in figures). In some embodiments, the semiconductor apparatus 20 dispenses a gas into the first carrier B12 before the door of the first carrier B12 is opened. Therefore, contaminants adhered on first wafers W11 are decreased. In some embodiments, the gas is nitrogen.

In some embodiments, the semiconductor apparatus 10 and 20 dispense the gas into the carriers B1 (such as the initial carrier B11, the first carrier B12, the second carrier B13, the third carrier B14, and the integration carrier B15) before the doors of the carriers B1 are opened in any steps of the wafer transport method.

After the first wafers W11 in the first carrier B12 are processed by the semiconductor apparatus 20, the first wafers W11 relative to the first group code are loaded into the integration carrier B15 disposed on the second load port 21 of the semiconductor apparatus 20 as shown in FIG. 3C.

In some embodiments, when the semiconductor apparatus 20 is ready to put the first wafers W11 into the integration carrier B15, the semiconductor apparatus 20 opens a door (not shown in figures) of the integration carrier B15, and takes the first wafers W11 into the integration carrier B15 by the wafer arm. In some embodiments, the semiconductor apparatus 20 dispenses the gas into the integration carrier B15 before the door of the integration carrier B15 is opened. Therefore, contaminants adhered on first wafers W11 are decreased.

After the second wafers W12 are processed by the semiconductor apparatus 10, the third wafers W13 are processed by the semiconductor apparatus 10. Afterward, as shown in FIG. 3C, the third wafers W13 relative to the third group code are loaded into the third carrier B14 disposed on the load port 11.

In step S113, the second wafers W12 in the second carrier B13 are processed by the semiconductor apparatus 20. Afterward, the second wafers W12 relative to the second group code are loaded into the integration carrier B15 disposed on the second load port 21 of the semiconductor apparatus 20 as shown in FIG. 3D.

Figure 3D:
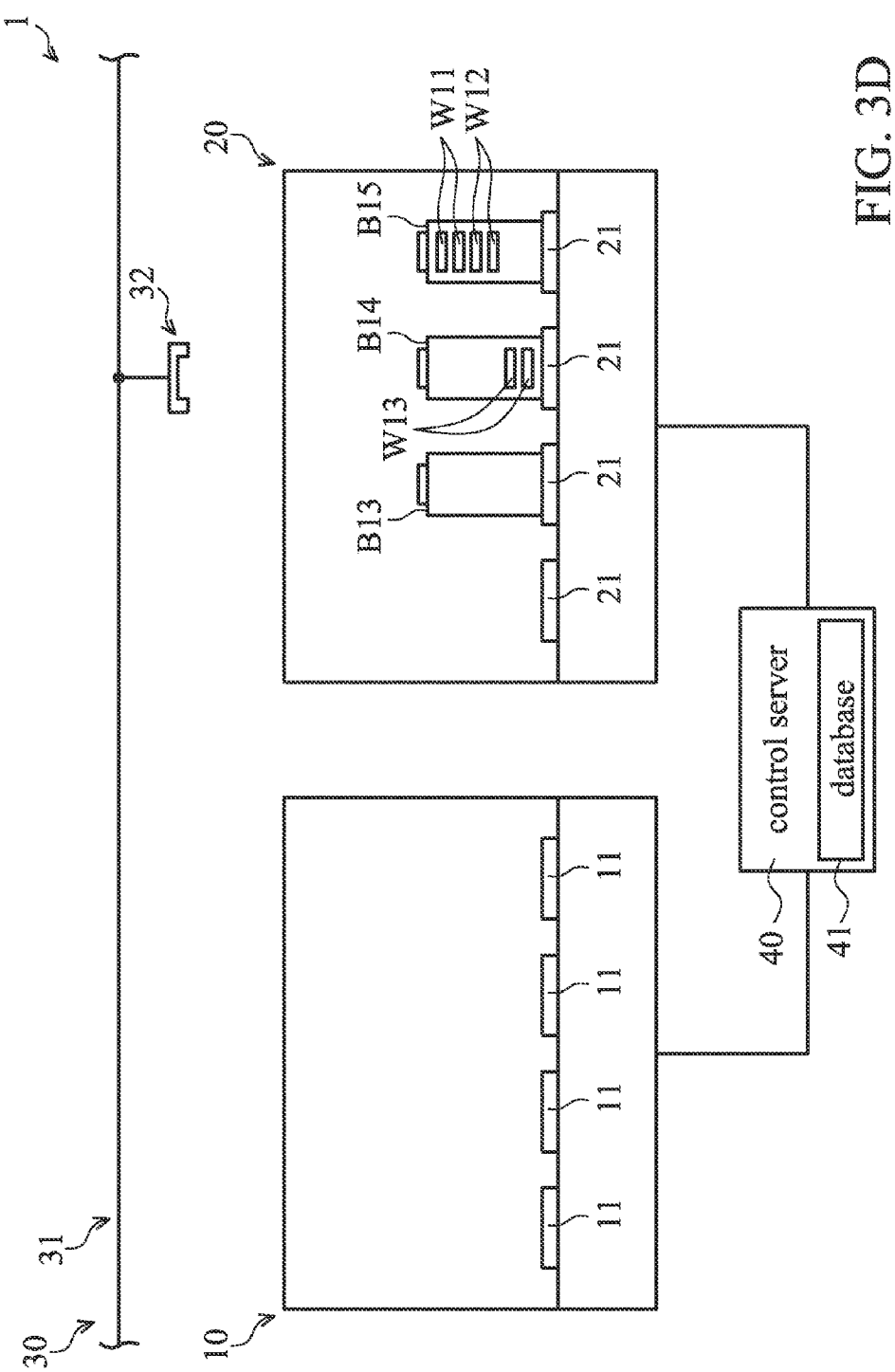
Figure 3E:
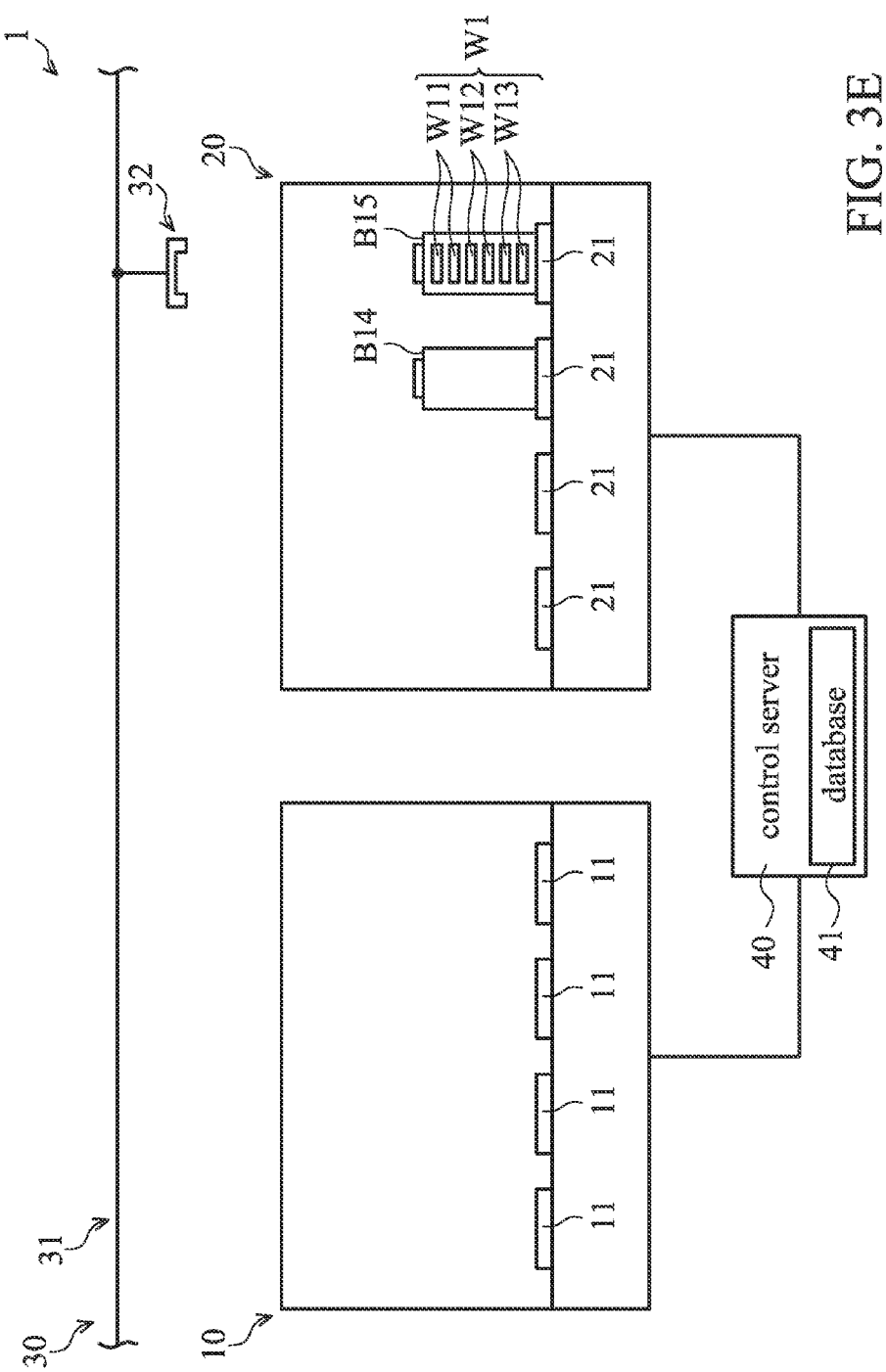

As shown in FIG. 3D, after the third wafers W13 are loaded into the third carrier B14, the third carrier B14 with the third wafers W13 are transported to the second load port 21 of the semiconductor apparatus 20 by the vehicle 32. As shown in FIG. 3E, the third wafers W13 in the third carrier B14 are processed by the semiconductor apparatus 20.

Afterward the third wafers W13 relative to the third group code are loaded into the integration carrier B15 disposed on the second load port 21.

Since the first wafers W11 and the second wafers W12 are processed by the semiconductor apparatus 20 before the third wafers W13 processed by the semiconductor apparatus 20, the period of the third wafers W13 waiting to be processed by the semiconductor apparatus 20 is short. Therefore, the processing period of the third wafers W13 processed by the semiconductor apparatuses 10 and 20 is decreased, and the third wafers W13 are easily processed by the semiconductor apparatus 20 within the quality-control time.

When the first wafers W11, the second wafers W12 and the third wafers W13 are disposed in the integration carrier B15, the semiconductor apparatus 20 deletes the group codes (the first, second, and third group codes) in the wafer-carrier information. Afterward, the semiconductor apparatus 20 transmits the modified wafer-carrier information to the control server 40.

Figure 4:
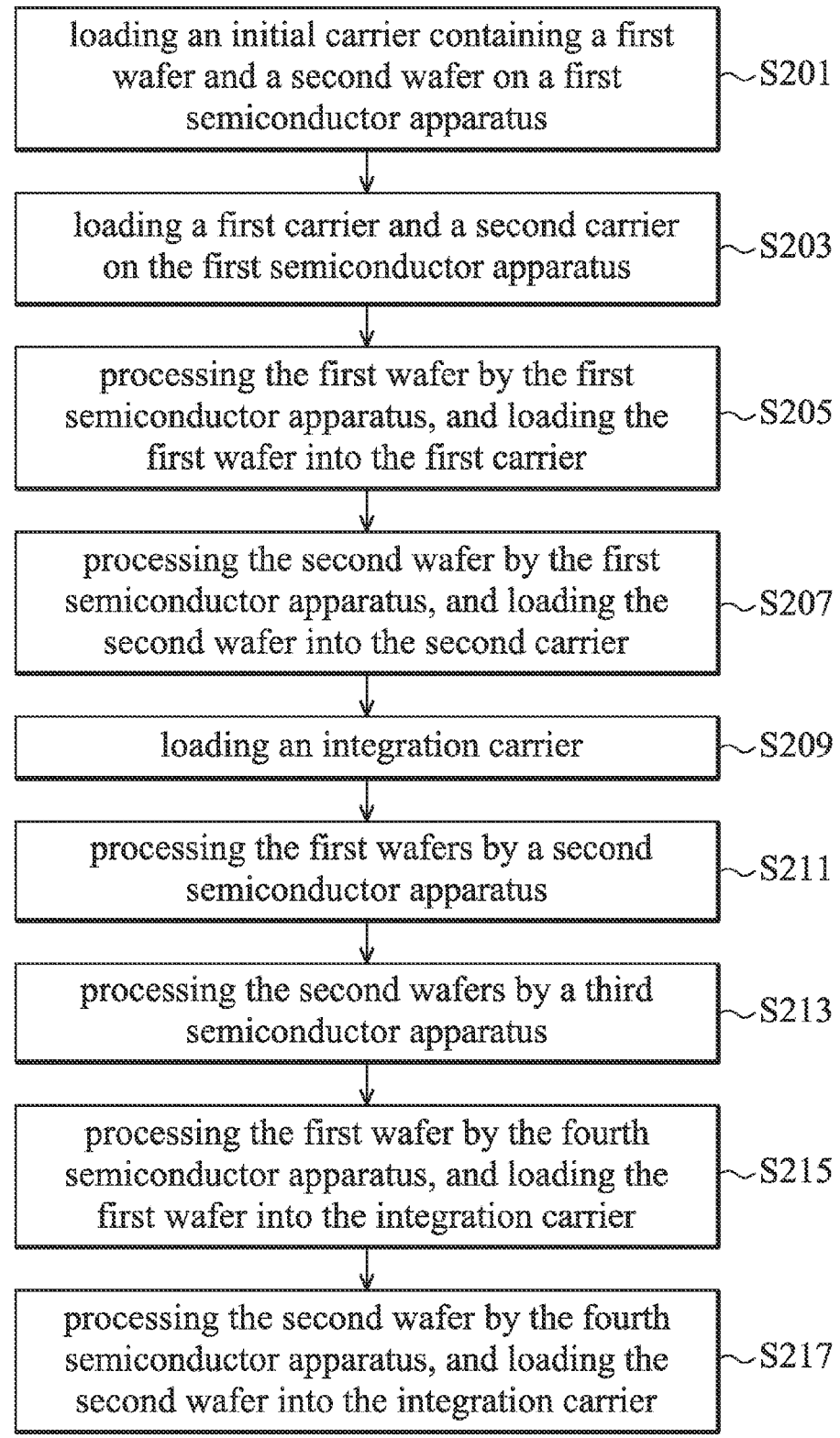
FIG. 4 is a flow chart of a wafer transport method in accordance with some embodiments of the disclosure.

FIG. 4 is a flow chart of a wafer transport method in accordance with some embodiments of the disclosure. FIGS. 5A to 5G are schematic views of the wafer transport system during intermediate stages of the transport method. The wafer transport system 1 further includes a number of semiconductor apparatuses 20 in FIG. 1 (assigned as 20a and 20b) and a semiconductor apparatus 50. In some embodiments, the semiconductor apparatus 50 is a photolithography apparatus for performing a baking process and a photolithography process on wafers W1.

The control server 40 is coupled with the semiconductor apparatuses 10, 20a, 20b and 50, and the OHT system 30.

Figure 5A:
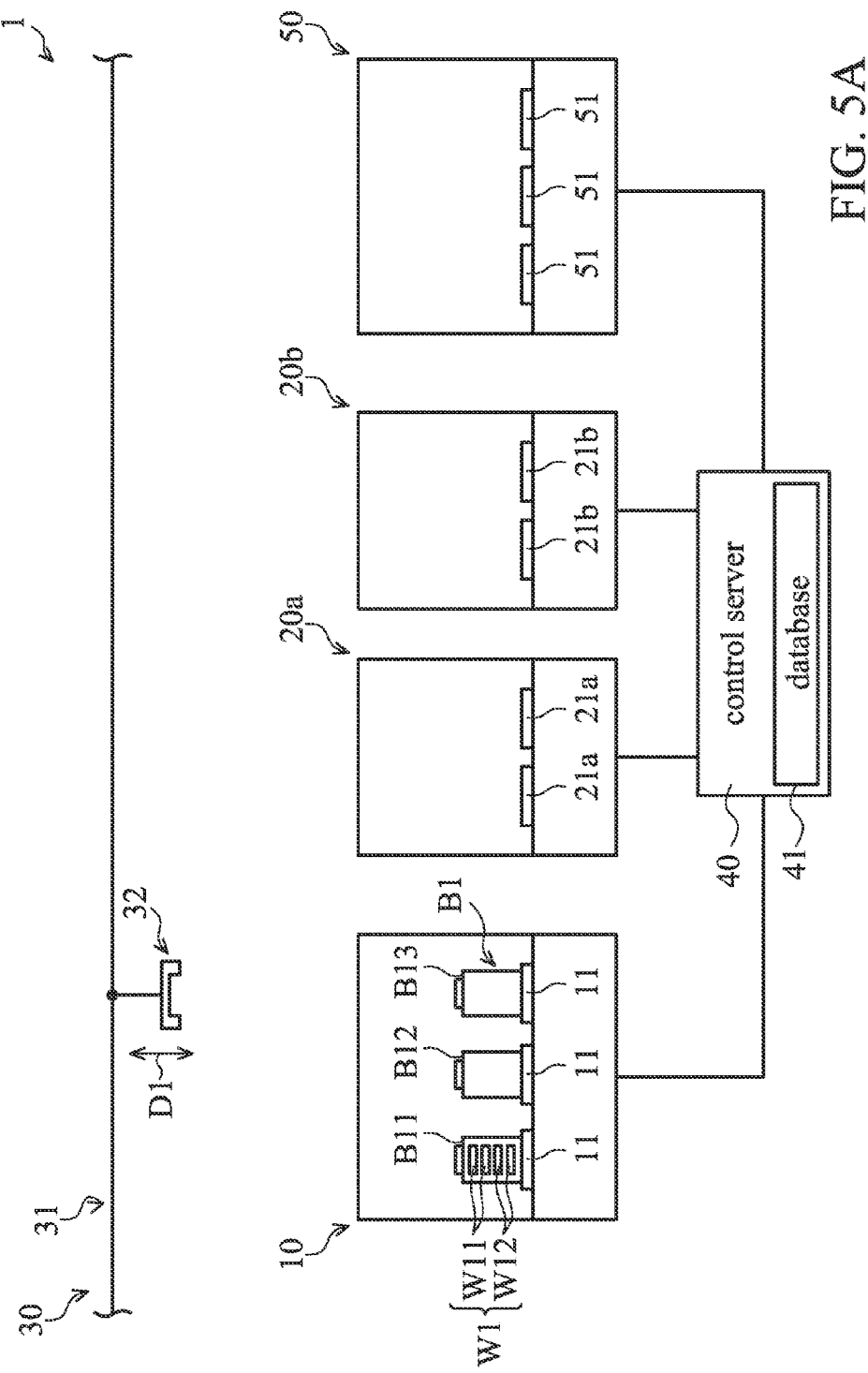
FIGS. 5A to 5G are schematic views of the wafer transport system during intermediate stages of the transport method.

In step S201, the initial carrier B11 is loaded onto the load port 11 of the semiconductor apparatus 10 as shown in FIG. 5A. The control server 40 processes a diving process for the wafers W1 in the initial carrier B11. In some embodiments, the wafers W1 in the initial carrier B11 are divided into two groups. The first wafers W11 of the wafers W1 are assigned a first group code, and the second wafers W12 of the wafers W1 are assigned a second group code by the control server 40.

In step S203, a first carrier B12 and a second carrier B13 are loaded onto the semiconductor apparatus 10 as shown in FIG. 5A because the wafers W1 in the initial carrier B11 are divided into two groups. The first carrier B12 and the second carrier B13 are disposed on the load ports 11 in sequence for increasing the utilization rate of the load ports 11.

In step S205, the semiconductor apparatus 10 processes the wafers W1 in sequence. The first wafers W11 are processed by the semiconductor apparatus 10. Afterward the first wafers W11 relative to the first group code are loaded into the first carrier B12 disposed on the load port 11 of the semiconductor apparatus 10, as shown in FIG. 5B.

In step S207, the second wafers W12 are processed by the semiconductor apparatus 10. Afterward the second wafers W12 relative to the second group code are loaded into the second carrier B13 disposed on the load port 11 as shown in FIG. 5C.

Figure 5B:
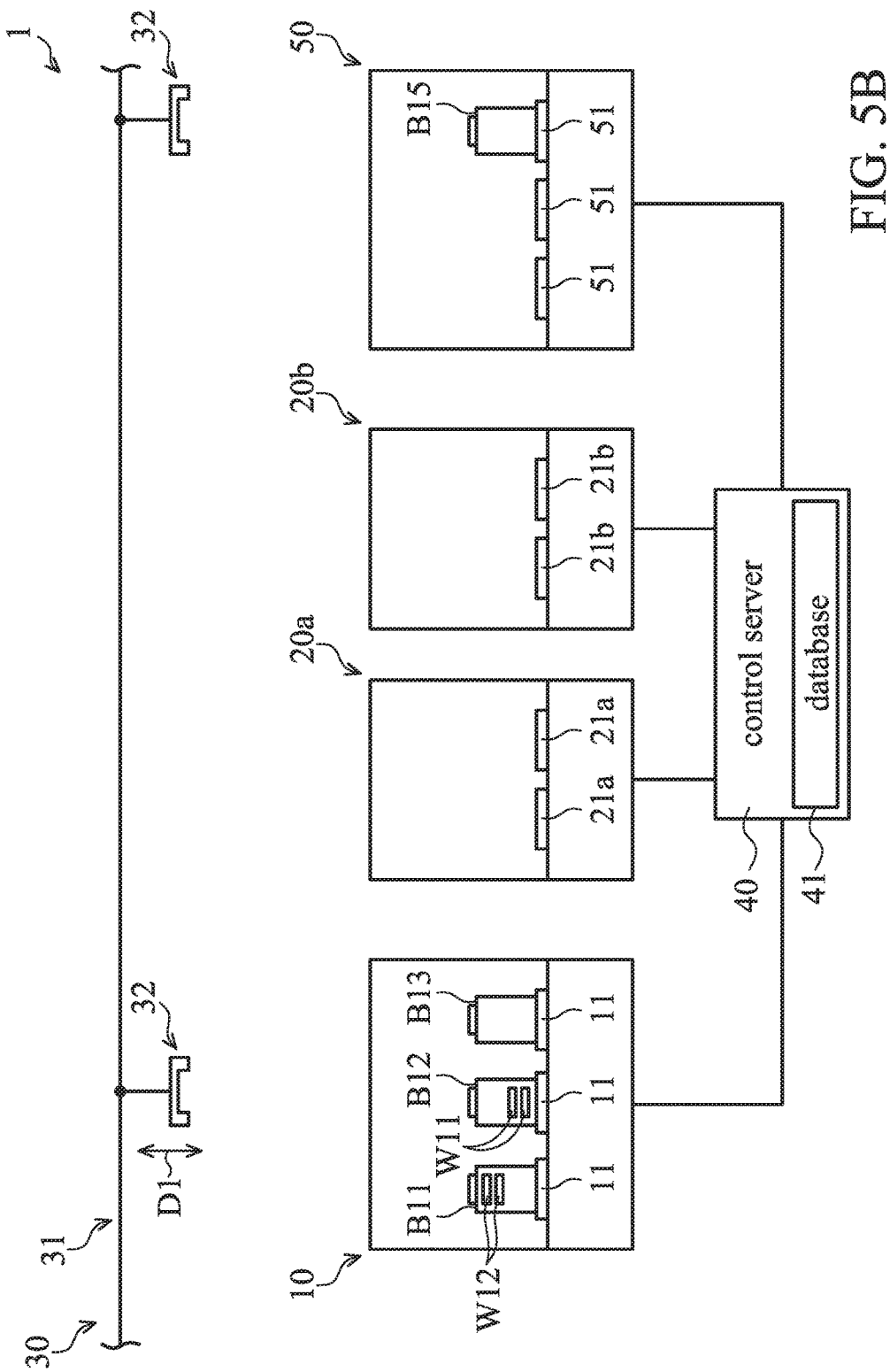
Figure 5C:
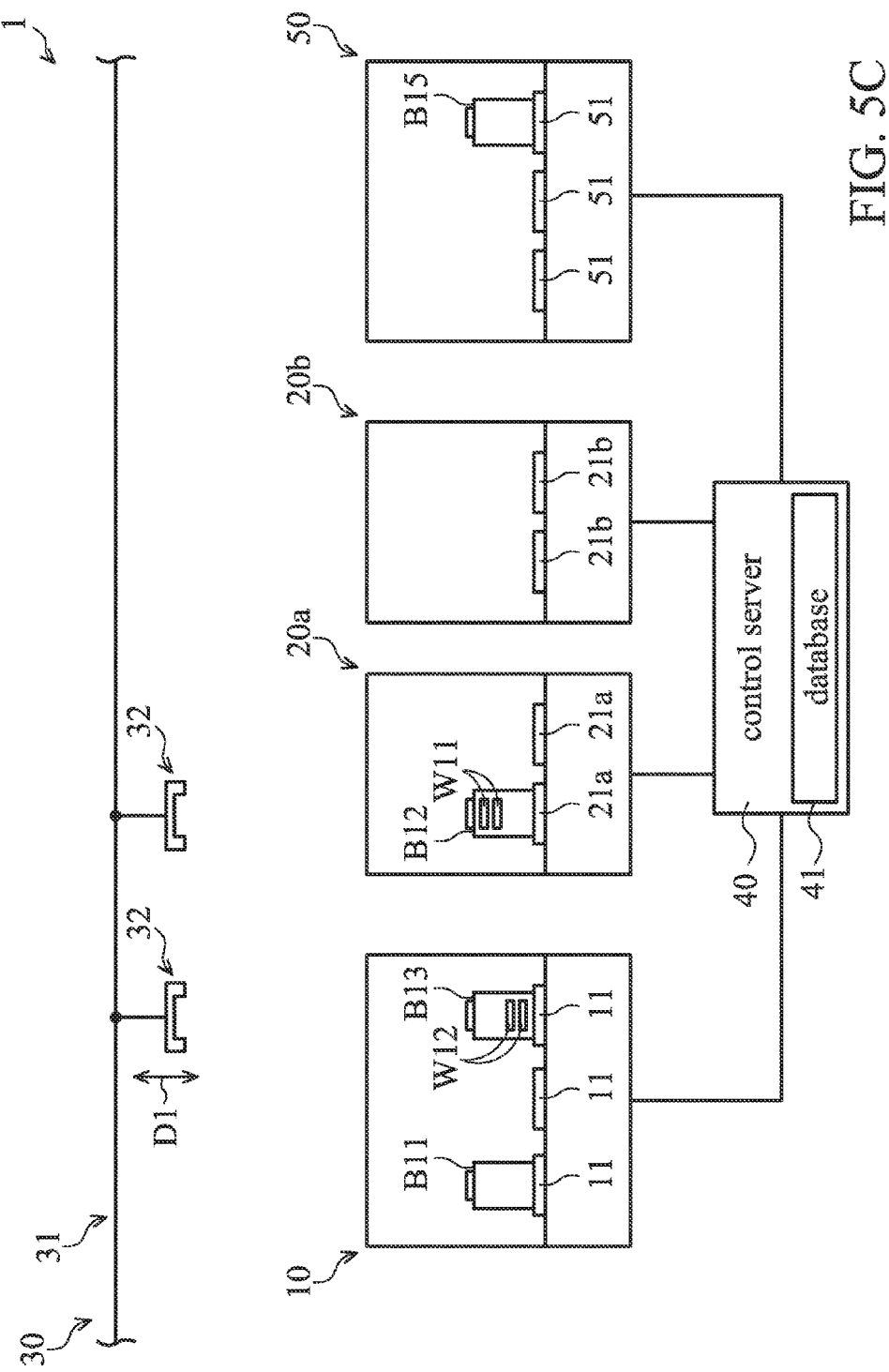
Figure 5D:
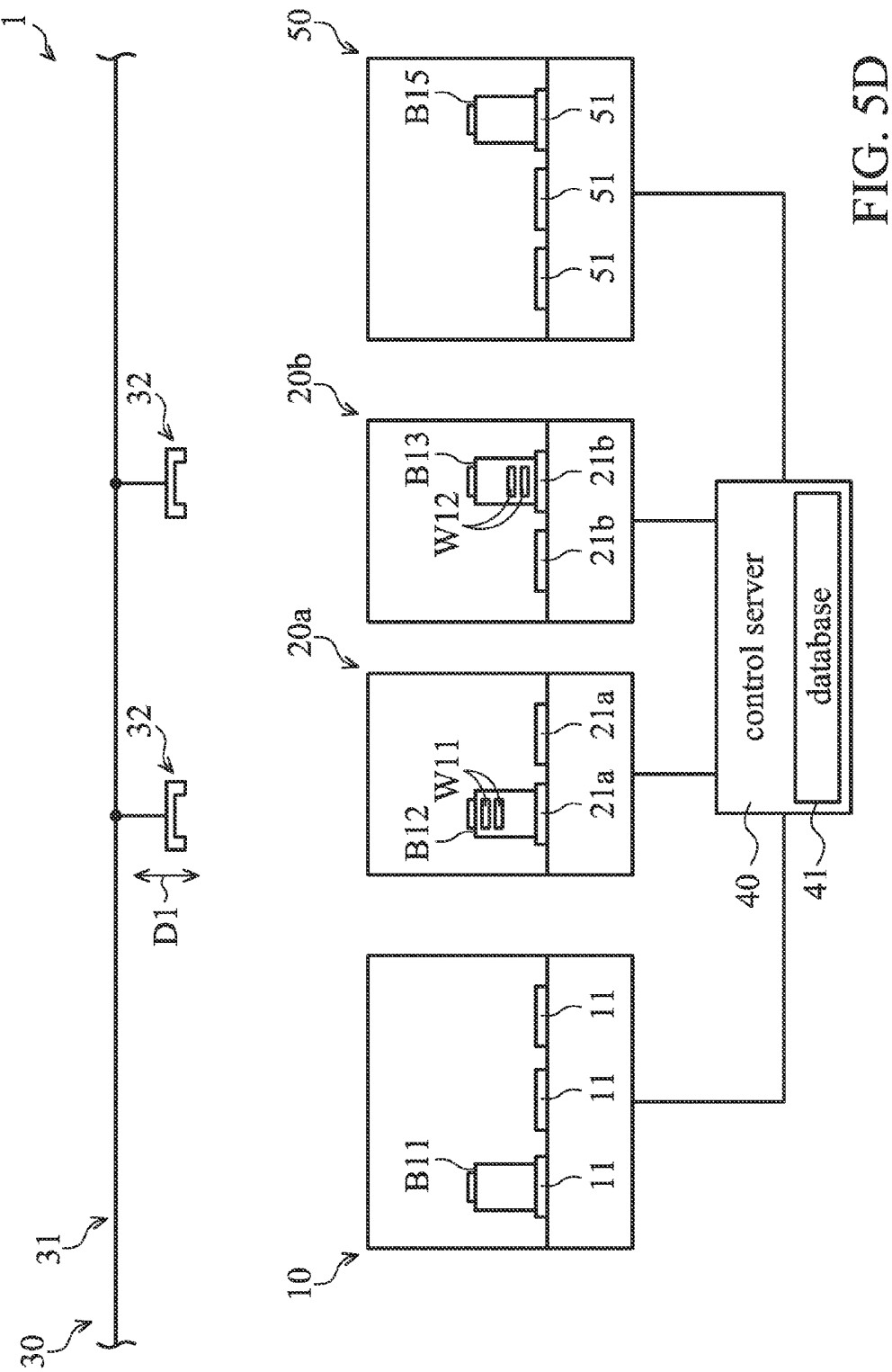

In step S209, an integration carrier B15 is loaded onto the second load port 51 of the semiconductor apparatus 50 before the first wafer W11 is processed by the semiconductor apparatus 50 as shown FIGS. 5B and 5C.

In some embodiments, the integration carrier B15 is loaded onto the second load port 51 before the first carrier B12 is loaded onto the second load port 51. In some embodiments, the integration carrier B15 is loaded onto the second load port 51 before the first carrier B12 is detached from the load port 21a.

In some embodiments, the integration carrier B15 is loaded onto the second load port 51 after the first carrier B12 is detached from the load port 11. In some embodiments, the integration carrier B15 is loaded onto the second load port 51 after the first carrier B12 is detached from the load port 21a.

In step S211, as shown in FIG. 5C, the first carrier B12 is transported to the semiconductor apparatus 20a by the vehicle 32. The first carrier B12 is loaded onto the load port 21a, and the first wafers W11 are processed by the semiconductor apparatus 20a. Afterward the first wafers W11 relative to the first group code are loaded into the first carrier B12 disposed on the load port 21a of the semiconductor apparatus 20a.

In step S213, as shown in FIG. 5C, the second carrier B13 is transported to the semiconductor apparatus 20b by the vehicle 32. The second carrier B13 is loaded onto the load port 21b, and the second wafers W12 are processed by the semiconductor apparatus 20b. Afterward the second wafers W12 relative to the second group code are loaded into the second carrier B13 disposed on the load port 21b of the semiconductor apparatus 20b.

Since the wafers W1 having different group codes, such as the first wafers W11 and the second wafers W12, can be individually processed by a number of semiconductor apparatuses, the processing period of the wafers W1 processed by the semiconductor apparatuses 10 and 50 are further decreased.

Figure 5E:
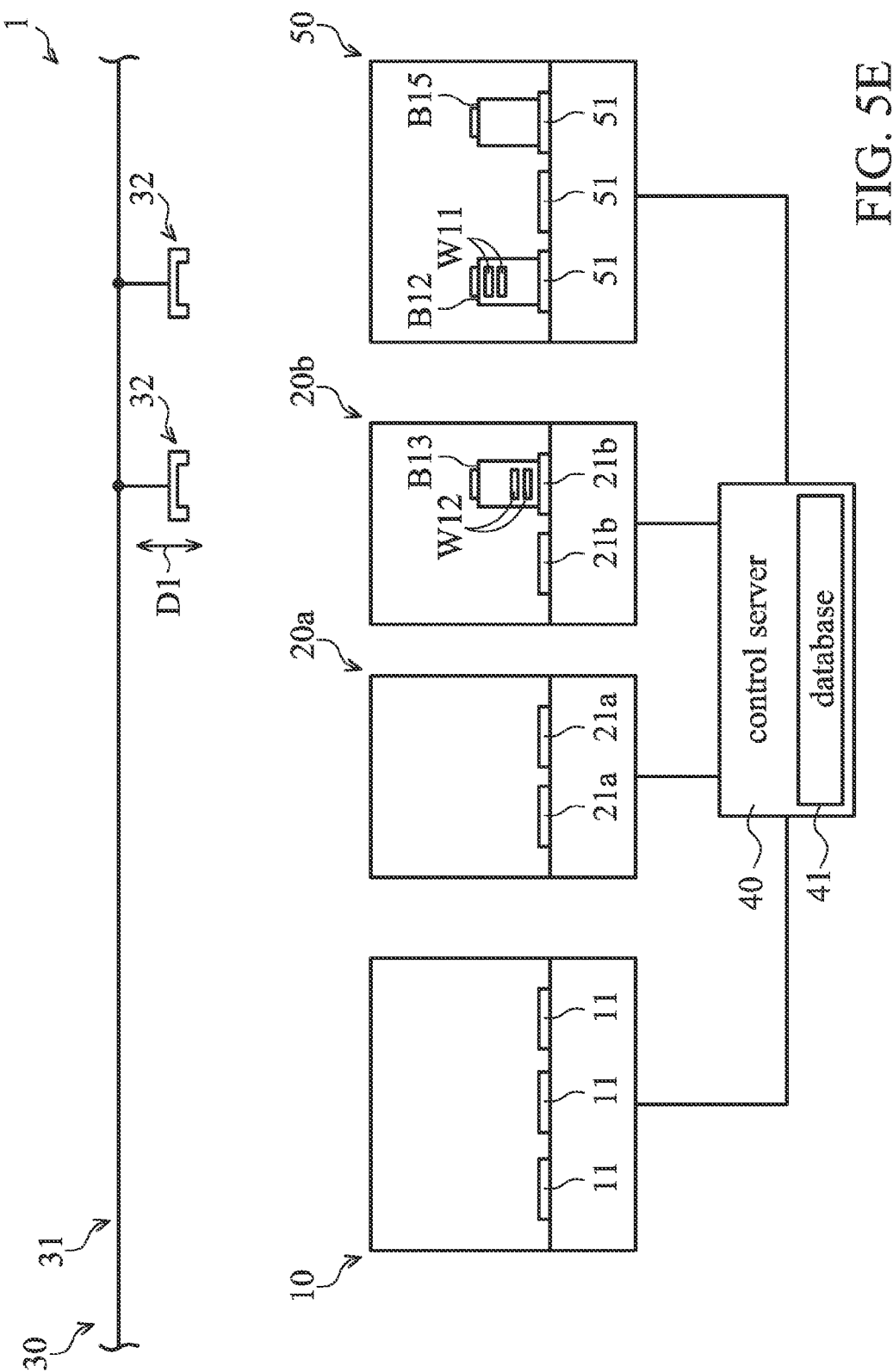

In step S215, as shown in FIG. 5E, after the first wafers W11 are processed by the semiconductor apparatus 20a, the first carrier B12 with the first wafers W11 are transported to the second load port 51 of the semiconductor apparatus 50.

After the first carrier B12 is loaded onto the load port 51, the first wafers W11 in the first carrier B12 are processed by the semiconductor apparatus 50. Afterward the first wafers W11 relative to the first group code are loaded into the integration carrier B15 disposed on the second load port 51 as shown in FIG. 5F.

Figure 5F:
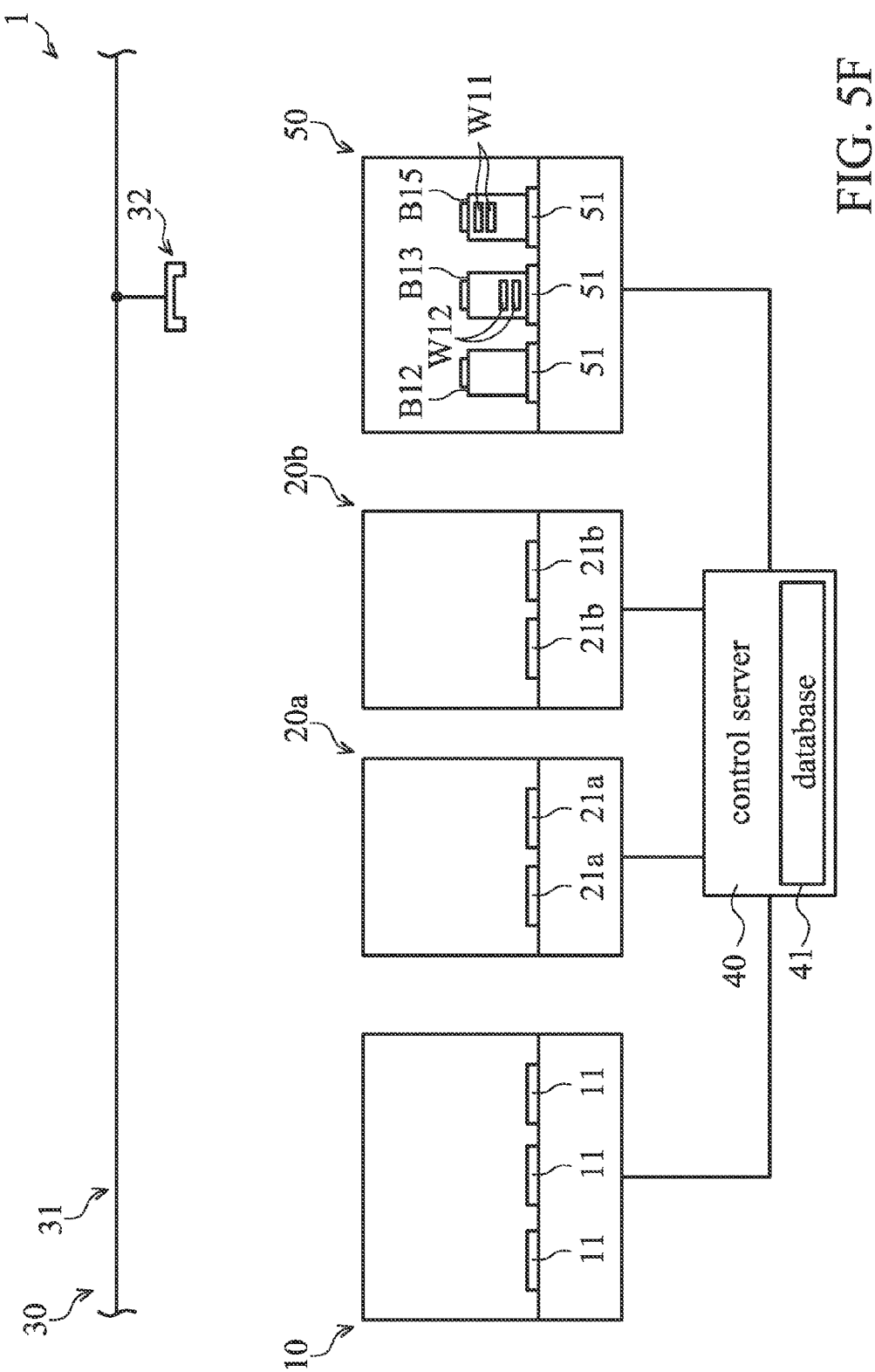

In step S217, as shown in FIG. 5f, after the second wafers W12 are processed by the semiconductor apparatus 20b, the second carrier B13 with the second wafers W12 are transported to the second load port 51 of the semiconductor apparatus 50.

Figure 5G:
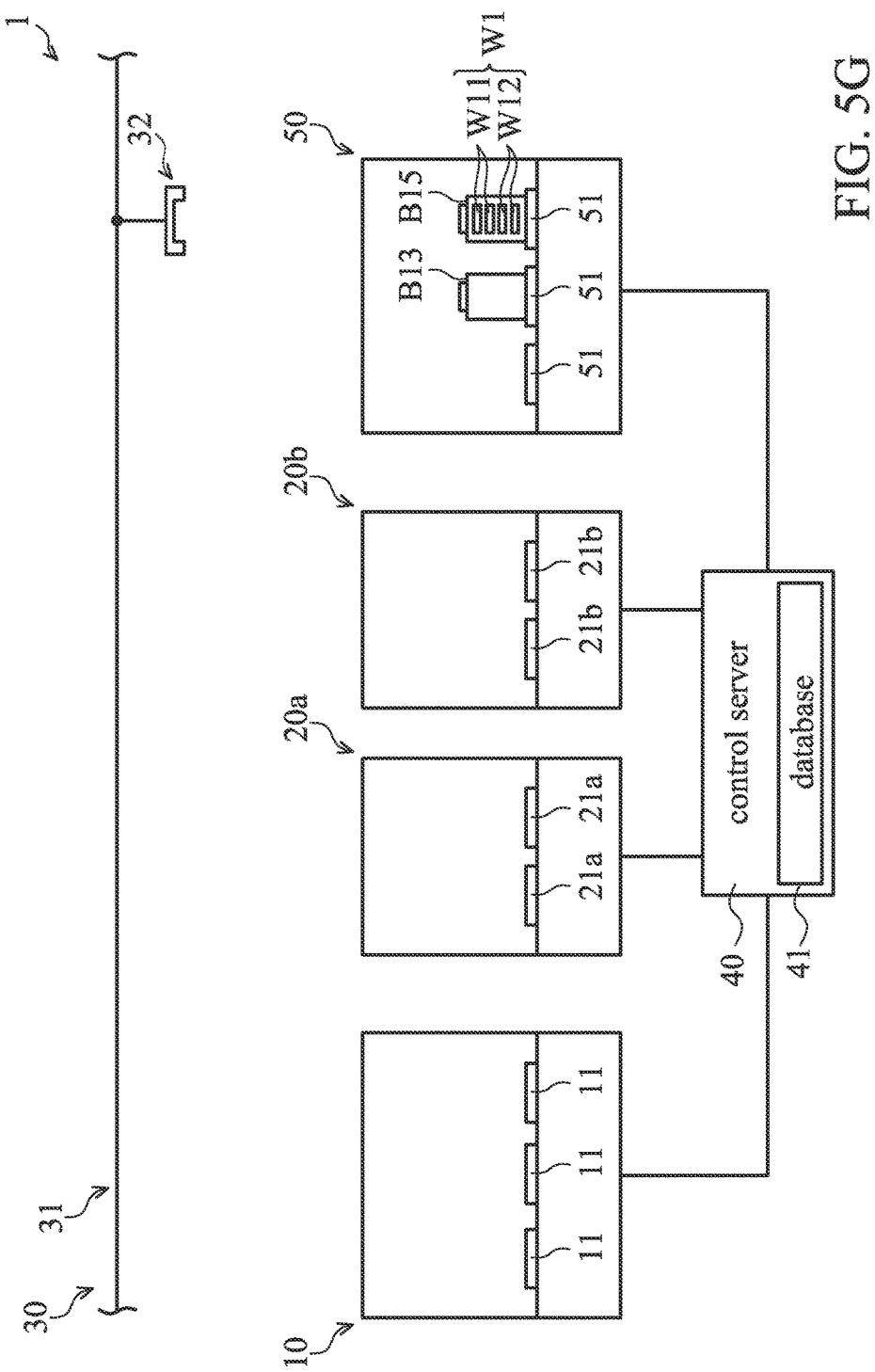

After the second carrier B13 is loaded onto the load port 51, the second wafers W12 relative to the second group code are loaded into the integration carrier B15 disposed on the second load port 51 as shown in FIG. 5G.

Embodiments of wafer transport methods are provided. The wafers W1 in the initial carrier B11 are assigned to several groups, and the wafers W1 of different groups are loaded into different carriers B1 on the semiconductor apparatus 10 after the wafers W1 are processed by the semiconductor apparatus 10. Therefore, the wafers W1 do not need to be loaded into different carriers B1 by a sorter apparatus, and the operation time of the wafers W1 loaded into different carriers B1 by a sorter apparatus is reduced.

In addition, the carriers B1 with different groups of wafers W1 are transported to the semiconductor apparatus 20 individually, and the wafers W1 in different carriers B1 are processed by the semiconductor apparatus 20 individually. Therefore, the processing period of the wafers W1 processed by the semiconductor apparatuses 10 and 20 is decreased, and the wafers W1 are easily processed by the subsequent semiconductor apparatus 20 within the quality-control time.

In some embodiments, a wafer transport method is provided. The wafer transport method includes loading an initial carrier containing a first wafer and a second wafer on a first semiconductor apparatus, and processing the first wafer by the first semiconductor apparatus, and loading the first wafer into a first carrier disposed on the first semiconductor apparatus. The wafer transport method also includes processing the second wafer by the first semiconductor apparatus, and loading the second wafer into a second carrier disposed on the first semiconductor apparatus.

The wafer transport method further includes processing the first wafer by a second semiconductor apparatus, and loading the first wafer into an integration carrier disposed on the second semiconductor apparatus. The wafer transport method further includes processing the second wafer by the second semiconductor apparatus, and loading the second wafer into the integration carrier disposed on the second semiconductor apparatus.

In some embodiments, a wafer transport method is provided. The wafer transport method includes loading an initial carrier containing a number of wafers on a first semiconductor apparatus, and assigning a first group code to some of the wafers and a second group code to some of the wafers. The wafer transport method also includes processing the wafers by the first semiconductor apparatus, and loading the wafers relative to the first group code into a first carrier disposed on the first semiconductor apparatus.

The wafer transport method further includes loading the wafers relative to the second group code into a second carrier disposed on the first semiconductor apparatus. The wafer transport method further includes processing the wafers in the first carrier by a second semiconductor apparatus, and processing the wafers in the second carrier by the second semiconductor apparatus. The wafer transport method further includes loading the wafers relative to the first group code and the second group code into an integration carrier disposed on the second semiconductor apparatus.

In some embodiments, a wafer transport method is provided. The wafer transport method includes loading an initial carrier containing a number of first wafers and a number of second wafers on a first semiconductor apparatus, and processing the first wafers by the first semiconductor apparatus, and loading the first wafers into a first carrier disposed on the first semiconductor apparatus. The wafer transport method also includes processing the second wafers by the first semiconductor apparatus, and loading the second wafers into a second carrier disposed on the first semiconductor apparatus.

The wafer transport method further includes processing the first wafers by a second semiconductor apparatus, and processing the second wafers by a third semiconductor apparatus. The wafer transport method further includes processing the first wafers by a fourth semiconductor apparatus, and loading the first wafers into an integration carrier disposed on the fourth semiconductor apparatus. The wafer transport method further includes processing the second wafers by the fourth semiconductor apparatus, and loading the second wafers into the integration carrier disposed on the fourth semiconductor apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer transport method, comprising:
   loading an initial carrier containing a first wafer and a second wafer on one of load ports of a first semiconductor apparatus;
   processing the first wafer by the first semiconductor apparatus, and loading the first wafer into a first carrier disposed on one of the load ports of the first semiconductor apparatus;
   processing the second wafer by the first semiconductor apparatus, and loading the second wafer into a second carrier disposed on one of the load ports of the first semiconductor apparatus;
   processing the first wafer by a second semiconductor apparatus, and loading the first wafer into an integration carrier disposed on one of load ports of the second semiconductor apparatus; and
   processing the second wafer by the second semiconductor apparatus, and loading the second wafer into the integration carrier disposed on the one of the load ports of the second semiconductor apparatus.

2. The wafer transport method as claimed in claim 1, further comprising assigning a first group code to the first wafer and a second group code to the second wafer when the first wafer and the second wafer are contained in the initial carrier.

3. The wafer transport method as claimed in claim 2, further comprising deleting the first group code and the second group code after the first wafer and the second wafer are loaded in the integration carrier.

4. The wafer transport method as claimed in claim 1, wherein the first wafer and the second wafer processed by the first semiconductor apparatus have a quality-control time in a range from about 30 minutes to about 120 minutes.

5. The wafer transport method as claimed in claim 1, further comprising loading the first carrier on the one of the load ports of the first semiconductor apparatus before the first wafer is processed by the first semiconductor apparatus, wherein the first carrier is an empty carrier.

6. The wafer transport method as claimed in claim 1, further comprising loading the second carrier on the one of the load ports of the first semiconductor apparatus before the second wafer is processed by the first semiconductor apparatus, wherein the second carrier is an empty carrier.

7. The wafer transport method as claimed in claim 1, further comprising loading the integration carrier on the one of the load ports of the second semiconductor apparatus before the first wafer is processed by the second semiconductor apparatus, wherein the integration carrier is an empty carrier.

8. A wafer transport method, comprising:
   loading an initial carrier containing a plurality of wafers on one of load ports of a first semiconductor apparatus;
   assigning a first group code to some of the wafers and a second group code to some of the wafers;
   processing the wafers by the first semiconductor apparatus;
   loading the wafers relative to the first group code into a first carrier disposed on one of the load ports of the first semiconductor apparatus, and loading the wafers relative to the second group code into a second carrier disposed on one of the load ports of the first semiconductor apparatus;

processing the wafers in the first carrier by a second semiconductor apparatus, and processing the wafers in the second carrier by the second semiconductor apparatus; and loading the wafers relative to the first group code and the second group code into an integration carrier disposed on one of load ports of the second semiconductor apparatus.

9. The wafer transport method as claimed in claim 8, further comprising determining whether assigning the first group code to some of the wafers and the second group code to some of the wafers according the number of the wafers and a quality-control time of the wafers.

10. The wafer transport method as claimed in claim 8, wherein the wafers processed by the first semiconductor apparatus have a quality-control time in a range from about 30 minutes to about 120 minutes.

11. The wafer transport method as claimed in claim 8, further comprising loading the first carrier and the second carrier on the first semiconductor apparatus in sequence, wherein the first carrier and the second carrier are empty carriers.

12. The wafer transport method as claimed in claim 8, further comprising loading the integration carrier on the one of the load ports of the second semiconductor apparatus before the wafers relative to the first group code are processed by the second semiconductor apparatus, wherein the integration carrier is an empty carrier.

13. The wafer transport method as claimed in claim 8, further comprising deleting the first group code and the second group code after the wafers are loaded in the integration carrier.

14. A wafer transport method, comprising:
loading an initial carrier containing a plurality of first wafers and a plurality of second wafers on one of load ports of a first semiconductor apparatus;

processing the first wafers by the first semiconductor apparatus, and loading the first wafers into a first carrier disposed on one of the load ports of the first semiconductor apparatus;

processing the second wafers by the first semiconductor apparatus, and loading the second wafers into a second carrier disposed on one of the load ports of the first semiconductor apparatus;

processing the first wafers by a second semiconductor apparatus;

processing the second wafers by a third semiconductor apparatus;

processing the first wafers by a fourth semiconductor apparatus, and loading the first wafers into an integration carrier disposed on one of load ports of the fourth semiconductor apparatus; and processing the second wafers by the fourth semiconductor apparatus, and loading the second wafers into the integration carrier disposed on the one of the load ports of the fourth semiconductor apparatus.

15. The wafer transport method as claimed in claim 14, further comprising assigning a first group code to the first wafers and a second group code to the second wafers when the first wafer and the second wafer are contained in the initial carrier.

16. The wafer transport method as claimed in claim 15, further comprising deleting the first group code and the second group code after the first wafers and the second wafers are loaded in the integration wafer.

17. The wafer transport method as claimed in claim 14, wherein the first wafers and the second wafers processed by the first semiconductor apparatus have a quality-control time in a range from about 30 minutes to about 120 minutes, the first wafers processed by the second semiconductor apparatus have a quality-control time in a range from about 30 minutes to about 120 minutes, and the second wafers processed by the third semiconductor apparatus have a quality-control time in a range from about 30 minutes to about 120 minutes.

18. The wafer transport method as claimed in claim 14, further comprising loading the first carrier and the second carrier on the first semiconductor apparatus in sequence, wherein the first carrier and the second carrier are empty carriers.

19. The wafer transport method as claimed in claim 14, further comprising loading the first wafers into the first carrier after the first wafers are processed by the second semiconductor apparatus, and loading the second wafers into the second carrier after the second wafers are processed by the third semiconductor apparatus.

20. The wafer transport method as claimed in claim 14, further comprising loading the integration carrier on the one of the load ports of the fourth semiconductor apparatus, wherein the integration carrier is an empty carrier.

* * * * *